United States Patent [19]
Buess et al.

[11] Patent Number: 5,233,300
[45] Date of Patent: Aug. 3, 1993

[54] DETECTION OF EXPLOSIVE AND NARCOTICS BY LOW POWER LARGE SAMPLE VOLUME NUCLEAR QUADRUPOLE RESONANCE (NQR)

[75] Inventors: Michael L. Buess, Alexandria, Va.; Allen N. Garroway, Fort Washington; Joel B. Miller, Cheverly, both of Md.

[73] Assignee: United States of America as represented by the Secretary of the Navy

[21] Appl. No.: 730,722

[22] Filed: Jul. 16, 1991

Related U.S. Application Data

[63] Continuation-in-part of Ser. No. 704,744, May 23, 1991, Pat. No. 5,206,592.

[51] Int. Cl.[5] .............................. G01R 33/20
[52] U.S. Cl. .................... 324/307; 324/318; 324/300
[58] Field of Search ............... 324/300, 307, 309, 310, 324/313

[56] References Cited

U.S. PATENT DOCUMENTS

| | | | |
|---|---|---|---|
| 4,166,972 | 9/1979 | King et al. | 324/310 |
| 4,296,378 | 10/1981 | King | 324/313 |
| 4,514,691 | 4/1985 | De Los Santos | 324/310 |
| 4,887,034 | 12/1989 | Smith | 324/307 |

OTHER PUBLICATIONS

Harding, Jr. et al., "A Pulse NQR-FT Spectrometer for Nitrogen-14", *J. Magn. Reson.* 36, 21 (1979).

Peterson et al., "N NQR and relaxation measurements of sodium nitrite", *J. Chem. Phys.* 64, 522 (1976).
Oskin, "Coherent Multipulse Sequences in N-14 NQR", *J. Mole. Struct.* 83, 243 (1982).
Sethares, "A New model for the flat conductor electromagnetic sun transducer", *J. Appl. Phys.* 49(3) 1978.
Marino, N-14 NQR and N-15 Wide NMR Spectroscopic Studies of Nitrocellulose, Final Technical Report For task 7-09 Oct. 1987.
Karpowicz, Librational Motion of Hexahydro-1,3,5, trinitro-S-tridzine Based on the Temperature Dependence of N-121 NQR Spectra.
The Relationship to Condensed-Phase thermal Decomposition J. Phys. Chem 1983 87, 2109-2112.

*Primary Examiner*—Michael J. Tokar
*Assistant Examiner*—Raymond Y. Mah
*Attorney, Agent, or Firm*—Thomas E. McDonnell; Barry A. Edelberg

[57] ABSTRACT

The sensitive detection of explosives and narcotics by nuclear quadrupole resonance (NQR) is performed at low rf power by assuring that the rf field strength is larger than the local magnetic field. Additionally, it has been recognized that signal-to-noise ratio of a signal induced by a specimen of fixed size decreases by only the square root of the coil size. Thus, rather than scaling power linearly with coil size, as conventionally done to maintain the same rf field intensity, the power need only be increased by the square root of the increased coil size to assure maintenance of the same signal to noise ratio. This technique permits the use of larger coils than previously used. The invention is useful for both volume coils and surface coils.

16 Claims, 5 Drawing Sheets

DETECTION OF EXPLOSIVE AND NARCOTICS BY LOW POWER LARGE SAMPLE VOLUME NUCLEAR QUADRUPOLE RESONANCE (NQR)

CROSS-REFERENCE TO RELATED APPLICATIONS

The present application is a continuation-in-part of Buess et al., DETECTION OF EXPLOSIVES BY NUCLEAR QUADRUPOLE RESONANCE, Ser. No. 07/704,744, Navy Case No. 72,625, filed May 23, 1991, now U.S. Pat. No. 5,206,592.

BACKGROUND OF THE INVENTION

1. Field of the Invention

The present invention is directed generally to a method and an improved system for detecting nitrogenous explosives or narcotics by nuclear quadrupole resonance (NQR), and more specifically, to a lower power method for detecting those materials.

2. Description of the Prior Art

In order to limit the unrestricted flow of explosives and narcotics, it is desired to detect sub-kilogram quantities of those materials in monitoring stations. Most military explosives and narcotics share common features: they are crystalline solids containing nitrogen. Presently, the explosive detections system and methods cannot reliably detect sub-kilogram quantities of military explosives against a background of more benign materials.

In conventional vapor-based systems, dynamites and contaminated explosives may be detected. However, military explosives such as hexhydro-1,3,5-trinitro-s-triazene (commonly referred to as RDX and 2,2-bis[(nitroxy)methyl]-1,3-propanediol, dinitrate (commonly referred to as PETN) are not reliably detected by the conventional vapor base systems especially when countermeasures are taken to reduce the effluent vapor and particles. Thermal neutron systems, which are $^{14}N$ detectors, can detect relevant quantities of explosives. Unfortunately, conventional thermal neutron analysis systems frequently alarm on nitrogen-containing plastics. High false alarm rates are produced for inspected bags containing a few bomb equivalents of nitrogen in a benign form since the conventional thermal neutron analysis systems are sensitive only to the nuclear cross sections and not to any details of the particular chemical environment of the detected nitrogen nuclear. Hence the false alarm rate is inherently high, even with some spatial discrimination. Also, nuclear magnetic resonance (NMR) has been considered for detecting explosives. Because a large magnetic field is conventionally required for NMR, magnetically recorded data would be undesirable altered and other magnetizable materials could be damaged. Furthermore, the conventional non-vapor methods and systems are not suitable for inspecting people.

The parent application of the present invention, Buess et al., DETECTION OF EXPLOSIVES BY NUCLEAR QUADRUPOLE RESONANCE, Ser. No. 07/704,744, Navy Case No. 72,625, filed May 23, 1991 (the entirety of which is incorporated herein by reference), discloses a method and system for NQR detection of explosives. Recited advantages of NQR for explosives detection are:

(i) Specificity: the NQR resonant frequency of a quadrupolar nucleus in a crystalline solid is quite well-defined. Most explosives of interest contain nitrogen and are crystalline solids. Most nitrogen found in the contents of airline bags is in a polymeric form, with associated broad, weaker NQR resonances and generally at frequencies other than the characteristic frequencies of the explosive. NQR is sensitive to the chemical structure, rather than just the nuclear cross-section, as in the thermal neutron analysis approaches. For NQR, false alarms from other nitrogenous materials will be far less of a problem than in nuclear-based detection techniques.

(ii) Sensitivity: though NQR is not a very sensitive spectroscopy, the parent disclosure describes techniques to make the response more sensitive to the desired explosive and less sensitive to interfering signals. Sensitivity is a function of coil geometry and coil size. The invention described in the parent disclosure has demonstrated sensitivity to detect the equivalent of sub-kilogram quantities of explosive near a brief case-sized meanderline coil and substantially less explosives in a small solenoidal coil of 25 mm diameter in a few seconds.

(iii) Localization: one of the novel features of the NRL approach is to localize the transmitting field and the receiver by a specialized surface coil, never previously used for NQR. One type of surface coil, the 'meanderline' coil, localizes the sensitive inspection region to a well-defined region. Furthermore, the electrical and magnetic fields of the meanderline coil fall off very rapidly with distance, so that a person can be scanned by an NQR detector without depositing substantial rf power into the body.

SUMMARY OF THE INVENTION

It is an object of the present invention to safely detect small quantities of nitrogenous explosives and narcotics within a large volume of material to be searched using low power techniques.

It is another object of the present invention to provide a system for detecting nitrogenous explosives and narcotics by nuclear quadrupole resonance over a large volume, at low power, less intense rf fields.

These and other objects are achieved by recognizing that the strength of the applied rf field need only be at least equal to the strength of the local magnetic field due to dipole-dipole interactions. A corollary of this principle is that the signal-to-noise ratio of a signal induced by a specimen of fixed size decreases by only the square root of the coil size, and using this recognition in the detection of explosives and narcotics by NQR. Thus, rather than scaling power linearly with coil size, as conventionally done to maintain the same rf field intensity, the power can be increased significantly less. Specifically, the power need only be increased by the square root of the increased coil size to assure maintenance of the same signal to noise ratio. This approach permits the use of larger coils than previously used. The approach is useful for both volume coils and surface coils.

For example, a more conventional approach would require an rf peak power of about 6 MW for a 300 liter inspection volume. In contrast we have achieved detection with power levels of 400 watts. A 5 watt meanderline coil NQR explosives detector is feasible for use on people: the prior approach would have necessitated about a peak power of about 30 kW.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

The technique utilized according to the present invention is pure nuclear quadrupolar resonance as taught in the previously mentioned Buess et al. patent application. Excitation and detection may be performed by any means known in the art, for example, a surface coil, such as a meanderline coil or a more conventional 'volume' coil such as a cylindrical or rectangular solenoid, a toroid, or a Helmholtz coil. Pure NQR is typically performed in zero magnetic field: no magnet is required.

As taught in the parent Buess et al. patent application, the specimen is irradiated with a train of radio-frequency (rf) pulses whose frequency has been chosen to be near to the known $^{14}$N NQR frequency of the explosive or narcotic. For example, RDX has resonance lines near 1.8, 3.4 and 5.2 MHz, while PETN's NQR resonances are near 0.4, 0.5, and 0.9 MHz. Any irradiation sequence useful in NQR processes may be used according to the present invention. One preferred irradiation sequence is the strong off-resonance comb (SORC), described in Klainer et al., *J. Mole. Struct.*, 58, 63 (1980), (the entirety of which is incorporated herein by reference) in which the pulse separations are less than the spin-spin relaxation time $T_2$, producing about one-half of the equilibrium magnetization after every pulse.

Figure 1:
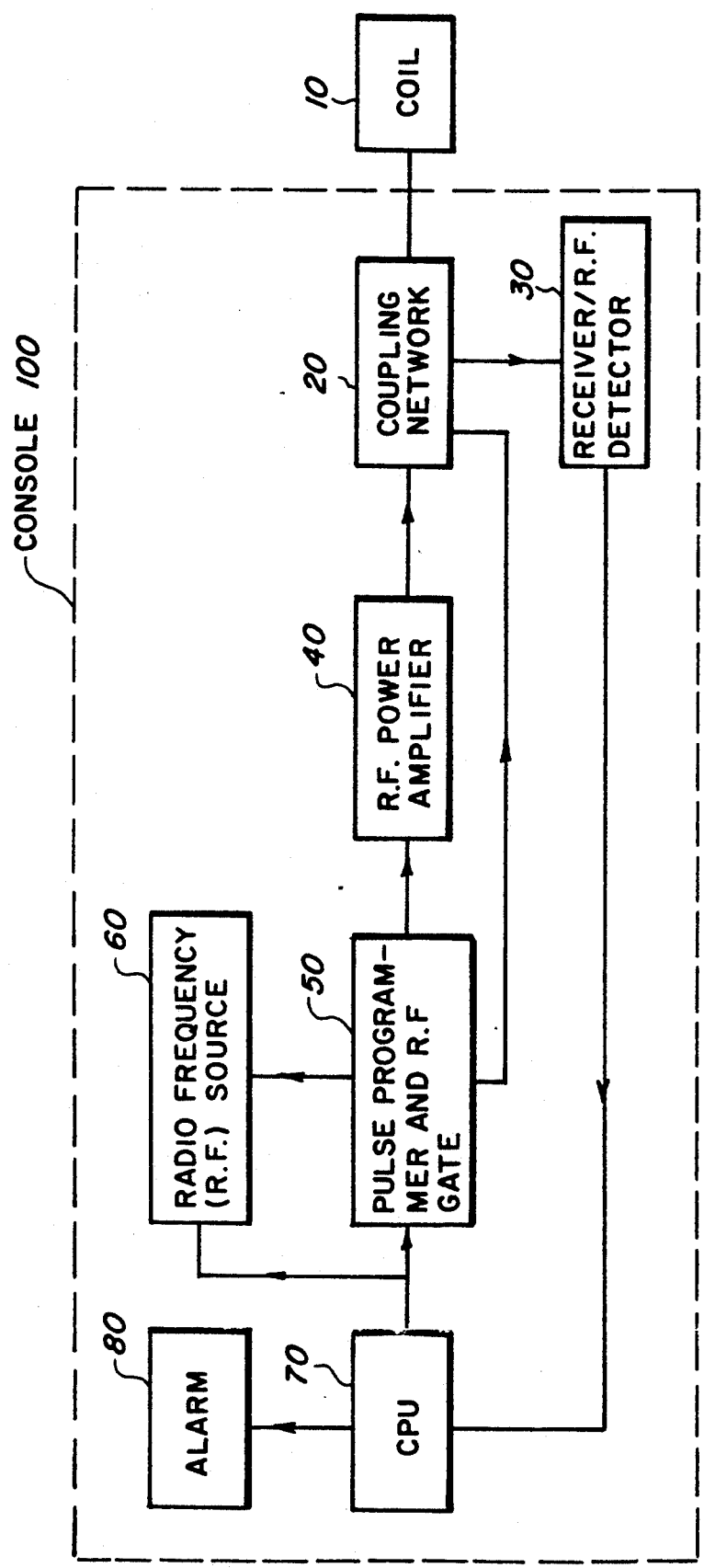
FIG. 1 illustrates a block diagram of the NQR system for the present invention.

FIG. 1 illustrates a block diagram for the NQR detection system for an embodiment of the present invention. A radio frequency source 60, a pulse programmer and RF gate 50 and an RF power amplifier 40 are provided to generate a train of radio frequency pulses having a predetermined frequency to be applied to a coil 10. A coupling network 20 conveys the train of radio frequency pulses from the radio frequency source 60, the pulse programmer and RF gate 50 and the RF power amplifier 40 to the coil 10. The coupling network 20 also conducts the signal to the receiver/RF detector 30 from the coil 10 after a specimen is irradiated with the train of radio frequency pulses. A central processing unit (CPU) 70 controls the radio frequency source 60 and the pulse programmer and RF gate 50 to a predetermined frequency which coincides or is near to a $^{14}$N NQR frequency of the type of explosive (e.g. all RDX-based explosives) or narcotic desired to be detected. The CPU 70 also compares the integrated nitrogen signal with a predetermined threshold value. When the predetermined threshold value is exceeded, an alarm 80 is activated in response to the comparison by the CPU 70. The coupling network 20, the receiver/RF detector 30, the RF power amplifier 40, the pulse programmer and RF gate 50, the radio frequency source 60, the CPU 70 and the alarm 80 may be contained in a console 100 with only the coil 10 being outside of the console 100.

Figure 2A:
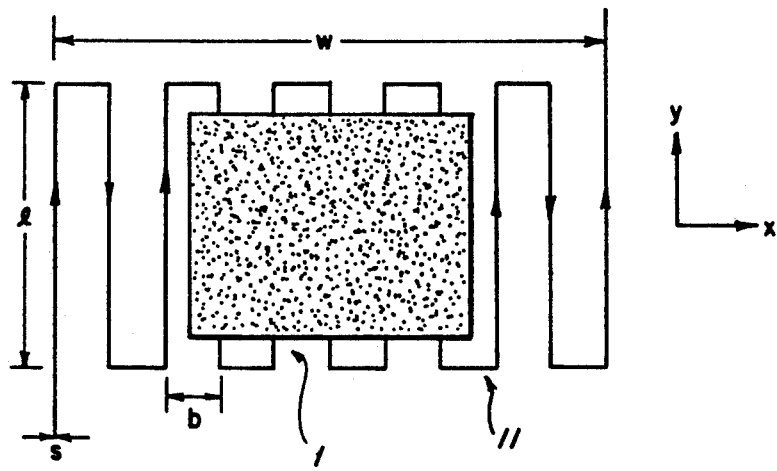
FIGS. 2A and 2B illustrate top and side views of a meanderline surface coil for an embodiment of the present invention with respect to a sample.
Figure 2B:
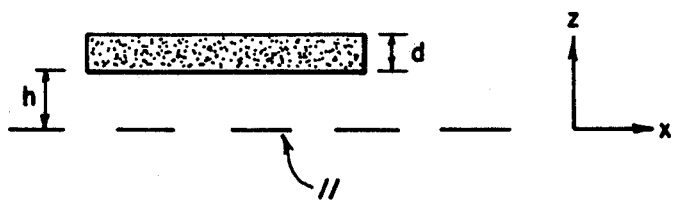

FIGS. 2A and 2B further illustrate the coil 10 as a meanderline surface coil 11 having a width w and a length l for detecting $^{14}$N pure NQR signals of a sample 1. The meanderline surface coil 11 is constructed of a serpentine array of parallel conductors being separated by a predetermined distance b. The conductor strips can theoretically be regarded as infinitely thin but having a finite width of s. FIG. 2B illustrates the sample 1, which has a thickness of d, being a height h above the surface of the meanderline surface coil 11.

In order to detect $^{14}$N pure NQR signals, it is necessary to use a coil producing an RF magnetic field which is confined as much as possible to the region of interest. The magnetic field in planes parallel to the surface of the meanderline surface coil 11 has a periodicity of the meanderline spacing b and the strength of the magnetic field drops off approximately at exp $(-\pi h/b)$ so that the effective RF magnetic field is confined to a region adjacent to the meanderline surface coil 11 with a penetration depth determined by the spacing b between the parallel conductors and not the overall size of the coil. As a result, the meanderline surface coil 11 is optimally suited for probing a sizable surface area to a limited depth. By contrast, the penetration depth of a more conventional circular surface coil is determined by the coil radius: making the circular surface coil larger increases the penetration depth.

The excitation and detection performed by the coil 10 utilizes a pure nuclear quadrupole resonance performed in zero magnetic field so that no magnet is required. In the preferred embodiment, a meanderline surface coil 11 as illustrated in FIGS. 2A and 2B is used. However, for certain specific geometries other coils may be quite suitable: for example, a conventional solenoid, rectangular solenoid, Helmholtz, or toroidal coil may be used. The specimen 1 is irradiated with a train of radio frequency pulses developed by the RF power amplifier 40, the pulse programmer and RF gate 50, the radio frequency source 60 and the CPU 70 to have a frequency near to the $^{14}$N NQR frequency of the type of explosives or narcotics desired to be detected. For example, RDX has NQR resonance lines near 1.8, 3.4 and 5.2 MHz and PETN has resonance lines near 0.4, 0.5 and 0.9 MHz. Hence all RDX-types of explosive would be detected by examination near to 1.8, 3.4 or 5.2 MHz.

In a preferred embodiment, the train of radio frequency pulses is a strong off resonance comb (SORC) of radio frequency pulses. For pulse separations $\tau$ less than the spin-spin relaxation time $T_2$, the size of the steady state response signal after every pulse is about ½ of the equilibrium magnetization. For a particular geometry the RF pulses are approximately 50 microseconds long and are spaced approximately 1 millisecond apart. In approximately 5 seconds, for example, 5000 signals can be coadded in order to improve the signal-to-noise ratio when compared to a single pulse or a conventional data taking approach which requires a delay approximately equal to the spin-lattice relaxation time $T_1$. Because $T_1$ for $^{14}$N is typically in the order of seconds, the improvement in the signal-to-noise ratio obtained in a given amount of time by using the SORC sequence is $(T_1/\tau)^{\frac{1}{2}}$ or a factor of approximately 30 in this example.

The predetermined frequency of the train of radio frequency pulses for the particular type of explosive or narcotic being detected is set to within 5 to 10 kHz of the nitrogen resonance. Because the resonance frequency is temperature dependent, it is desirable to sweep the frequency over a range of 10 or 15 kHz. For example, the 5.2 MHz resonance lines of RDX vary by approximately 25 kHz over a temperature range of 0° to 50° C. while the 1.8 and 3.4 MHz lines of RDX vary by approximately 12.5 kHz over the temperature range of 0° to 50° C. Within the frequency sweep of 10 to 15 kHz, the signal intensity will vary proportional to $|\cos(\pi\delta f\tau)|$ where $\delta f$ is the resonance frequency offset. It is to be noted that the swept signal intensity will sum to a positive value even though the exact resonance frequency may be unknown.

After applying the train of radio frequency pulses to the coil 10, the integrated nitrogen signal from the coil passes through a receiver/RF detector 30 and is input to the CPU 70. The integrated nitrogen signal is compared to a predetermined threshold value and the alarm 80 is activated when the integrated nitrogen signal exceeds the predetermined threshold value.

In an embodiment of the present invention, the coupling network 20, the receiver/RF detector 30, the RF power amplifier 40, the pulse programmer and RF gate 50, the radio frequency source 60, the CPU 70 and the alarm 80 are contained in a console 100 with the coil 10 attached thereto so that the scanner coil can be placed next to the specimen desired to be detected.

FIG. 2A indicates the direction of the current flow in the serpentine array. A current density $J_S(x)$ is related to the total current I as illustrated in the relationship of $$\int_0^{s/2} J_s(x)dx = \tfrac{1}{2}I. \quad [1]$$

Figure 3:
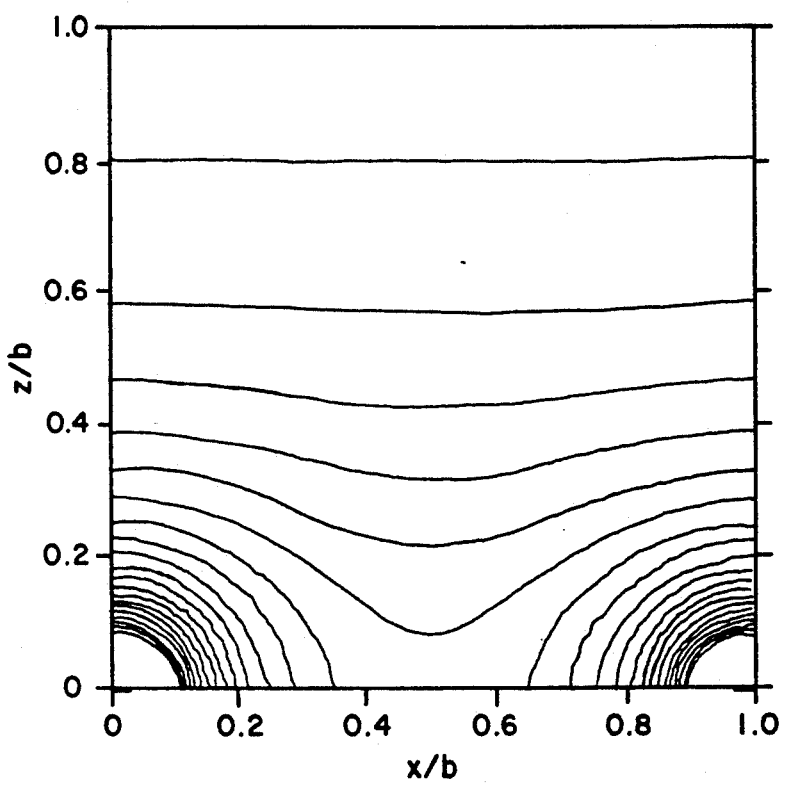
FIG. 3 illustrates the contour lines for the magnetic field strength of a meanderline surface coil in the XY plane.

By using magnetostatic boundary conditions, $J_S(x)$ between the conducting strips is 0 and $J_S(x)$ within the conducting strips corresponds to the relationship of $$J_s(x) = \frac{2\beta}{(2[\cos(2\pi x/b) - \cos(\pi s/b)])^{\frac{1}{2}}}, \quad [2]$$

where $\beta = \pi I[2bK(q)]^{-1}$ and K(q) is the complete elliptic interval of the first kind with modulus $q = \sin(\pi s/2b)$. The resulting magnetic field components in the region of $z > 0$ and $B_y = 0$ is $$B_{\genfrac{}{}{0pt}{}{x}{(z)}} = \left(\genfrac{}{}{0pt}{}{-}{+}\right)\mu_o\beta\sum_{n=0}^{\infty}P_n[\cos(\pi s/b)]\exp[-(2n+1)\pi z/b] \times \genfrac{}{}{0pt}{}{\cos}{\sin}\bigg)[(2n+1)\pi x/b], \quad [3]$$

where $P_n[\cos(\pi s/b)]$ is a Legendre polynomial of order n. In a thin layer sample adjacent to a meanderline surface coil, both the strength and direction of the RF magnetic field vary over the specimen according to equation [3]. An average must be taken at each location within the sample in order to obtain the NQR signal intensity. The quantity of interest in NQR detection is the magnitude of the RF field $B_1 = 2[B_x^2 + B_z^2]^{\frac{1}{2}}$. FIG. 3 illustrates the contour presentation of the magnetic field intensity from equation 3 and predicts the RF field profile. As illustrated in FIG. 3, the z component of the magnetic field reaches a maximum midway between the conducting strips and the modules of the magnetic field is maximum near the strip edges where $B_x$ is large but the magnetic field never vanishes between the conducting strips due to the contribution of $B_z$.

Figure 4:
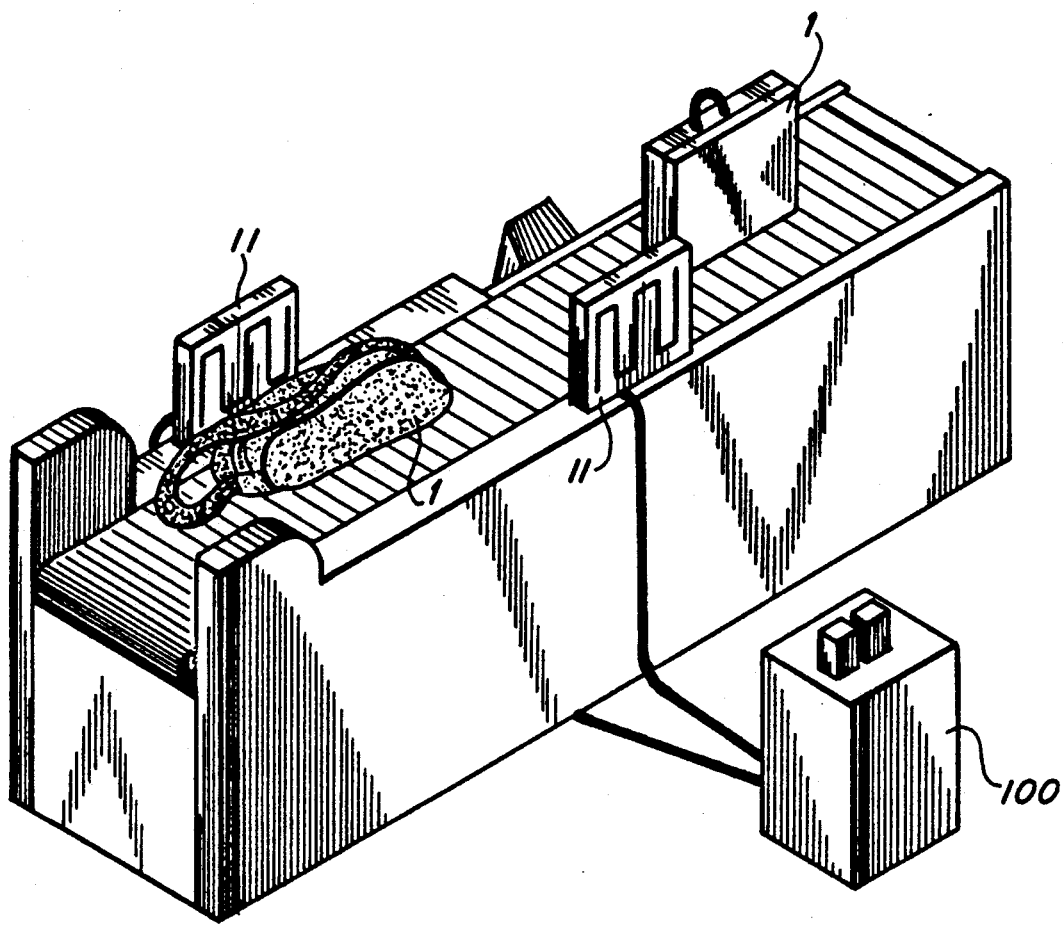
FIGS. 4 and 5 illustrate the implementation of the NQR detection system for the present invention.
Figure 5:
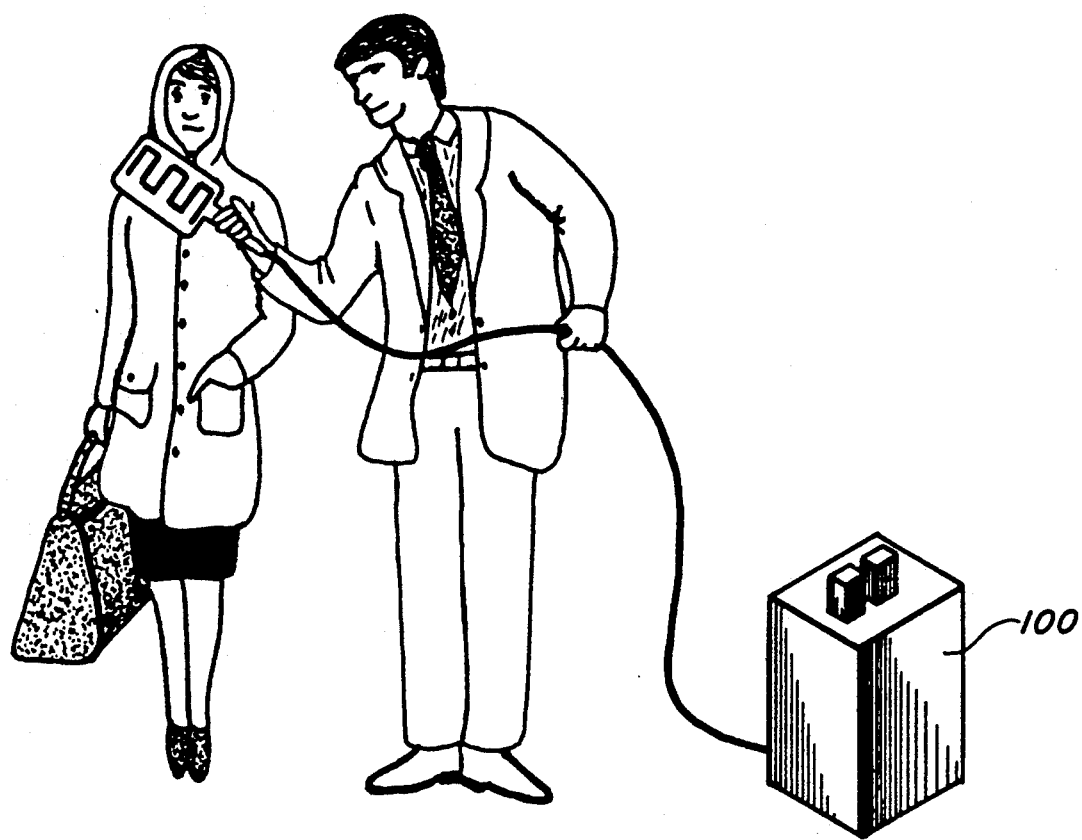

FIGS. 4 and 5 illustrate possible use of such an NQR system for detecting explosives and narcotics in actual use. For clarity in FIG. 4 two meanderline inspection coils are shown quite far from the baggage to be inspected. In such an application, the geometry would be altered to bring the coils much closer to the bags.

Conventionally, intense rf magnetic fields are used to excite the NQR lines and generation of such intense fields requires substantial rf power with associated possibility of depositing unacceptable amounts of power into the scanned objects. Power deposition can have unfortunate consequences for scanning of baggage and small cargo, wherein at some suitably high power level, damage to electronics may occur by over voltage or local heating through electrostatic coupling of the electric field or inductive coupling to the magnetic field. For scanning people, rf power deposition, primarily by eddy current loss, can pose a problem at these frequencies (1–5 MHz). A detailed discussion of the effects of rf power and field strength values on articles and persons and the acceptable levels of exposure to rf energy is unnecessary here and beyond the scope of this disclosure. It is sufficient to state that an advantage of the present approach that average and peak rf power levels can be reduced by orders of magnitude below those used in prior practice.

An rf field strength of $B_1$ applied near the resonance frequency nutates the spins (for a spin I=1 nucleus) through an angle of $2\gamma B_1 t_W$, where $\gamma$ is the magnetogyric ratio of the nuclear spin and $t_W$ is the pulse width. For a fixed nutation angle, an intense pulse has a shorter duration and, correspondingly, excites a broader region of the spectrum. Conventionally, one excites the NQR resonance with a pulse sufficiently long to cause the spins to nutate through about 119°, giving a maximum magnetization. On commercial NQR spectrometers in a laboratory setting, the pulses required to obtain 119° tip angle typically have widths of 20–50 $\mu$s and cover a bandwidth $1/t_W$ of 50–20 kHz. The rf field strength $B_1$ used in such cases is therefore 10–25 gauss.

As part of the present invention, it was recognized that the magnitude of the rf field strength need only be larger or equal to the magnitude of the local magnetic field strength due to dipole-dipole contributions. Hence the necessary rf field strength $B_{1min}$ is of the order of $1/\gamma T_2$ where $T_2$ is the spin-spin relaxation time due to dipolar decoupling. Therefore, for example, the strong off resonance comb excitation will work quite satisfactorily at such low rf intensity. For RDX-based explosives, the present invention has successfully utilized rf fields as low as 0.7 G (0.07 mT). (The width of the $^{14}$N NQR line is also partly determined by inhomogeneous interactions due to distribution of the quadrupolar coupling constants, induced by strain, impurities and variations in temperature. Such an inhomogeneous contribution to the width is not as important as the homogeneous contribution from the dipole-dipole coupling.)

Therefore, although the prior art applies an rf field of a strength that is at least 100 times greater in magnitude than that of the local magnetic field, the present invention achieves successful NQR detection of nitrogenous explosives and narcotics by using a rf field strength to local field strength ratio of from 1 or about 1 to about 50, preferably as close as possible to 1. Typically, a ratio of about 2 to about 30, more typically a ratio of about 2 to about 20, and most typically a ratio of about 2 to about 10 is used.

A second, related aspect of the present invention is the use of large volume sample coils: since only rather modest rf field strengths are required, a fixed rf power can irradiate a much larger volume by the present method. In a coil of effective volume V and quality factor Q, a pulse of power P creates a rf field strength $B_1$ proportional to $(PQ/V\nu_o)^{\frac{1}{2}}$, where $\nu_o$ is the carrier frequency. By the principle of reciprocity, the signal-to-noise ratio obtainable from a given amount of sample will scale with the strength of $B_1$ per unit current. Hence, provided there is sufficient power to irradiate the NQR line, a specimen of fixed size will induce a signal which scales as (coil volume)$^{-\frac{1}{2}}$. For example the penalty in signal-to-noise ratio increasing coil volume by a factor of 15000 on comparing a 20 cm$^3$ coil to a 300 liter coil volume is about 120.

Thus, according to the present invention, one can irradiate, for example, a volume of about 300 liters and detect significant quantities of explosive in a reasonably short time with an rf peak power of 400 watts, the same peak power conventionally employed on a small 20 cm$^3$ coil system. If one followed the more prior art approach of maintaining the same rf field intensity $B_1$, one would need to scale the power linearly with coil volume, necessitating an rf peak power of 6 MW for the 300 liter system, in contrast to the 400 watts used according to the present invention. In the present invention, the scaling of peak power with size can be significantly less than linear.

As the NQR transitions are induced by rf pulses, discussion so far has centered on the pulse or peak power which creates the (peak) rf magnetic field intensity. Peak power dictates not only the necessary power requirement of the rf transmitter, but also determines the peak voltages induced in the specimen. One must also be concerned with average power which also places some requirements on the rf transmitter and also determines the maximum power which is deposited into the scanned object. (It must be noted that most of the rf energy is dissipated in the coil by resistive losses, with only a fraction dissipated in the specimen through dielectric or eddy current losses. Furthermore, where power dissipation in the specimen may be a problem, there are other well-known rf shielding techniques which can reduce the fraction of the rf power actually dissipated in the specimen.) To appreciate the advantages of the present invention, consider scaling up the coil volume while keeping the rf peak power essentially fixed. For simplicity of argument, keep the nutation angle about the same in the large volume coil as in the small coil. Hence the rf pulse length will need to be increased in direct proportion to (coil volume)$^{\frac{1}{2}}$, and so the average power will increase by that same factor, provided the same pulse spacing is maintained. That is, the scaling of average power with size can be significantly less than linear, and in particular, may be between as low as proportionate to the square root of coil volume without significantly decreasing the signal to noise ratio. In the SORC sequence a typical rf pulse duty factor with short pulses spaced closer than the spin-spin relaxation time $T_2$ might be 0.2% for a small volume coil. To maintain the same nutation angle and the same spacing between pulses, a duty cycle of about 25% is then required for the 300 liter coil. For operating conditions with a peak power of 400 w, the average power dissipated in the small coil would be 0.8 W and, by the present invention, only 100 W in the 300 liter coil, far less than the 6 kW average power which would be dictated by maintaining the large rf magnetic field in the large sample coil.

While the above description has focused on "volume coils", for the sake of simplicity, other types of coils, such as the circular surface coil, the pancake coil, the meanderline and other variants, may be successfully used in conjunction with the principles of the present invention.

The improvement offered by the present invention to that disclosed in the parent patent application is that very large sample volumes can be inspected for explosives or narcotics by NQR, without a proportional increase in peak power or average power levels. In practice, suitcase-sized sample volumes can be inspected at rather modest peak and average rf power levels. Furthermore, this approach makes feasible the examination of people by large surface coils, such as the meanderline, or even 'volume' coils such as a solenoid, as indicated below.

Obviously, many modifications and variations of the present invention are possible in light of the above teachings. It is therefore to be understood that, within the scope of the appended claims, the invention may be practiced otherwise than as specifically described.

What is claimed is:

1. A method for detecting a class of explosives and narcotics containing nitrogen in a specimen by nuclear quadrupole resonance, comprising the steps of:
    (a) generating a train of radio frequency pulses having a predetermined frequency;
    (b) transmitting said train of radio frequency pulses to a coil;
    (c) irradiating the specimen with an rf field of predetermined strength in response to said train of radio frequency pulses transmitted to said coil at said step (b), said specimen having a local magnetic field due to dipole-dipole contributions;
    (d) detecting an integrated nitrogen signal in response to irradiating the specimen at said step (c);
    (e) receiving said integrated nitrogen signal detected at said step (d);
    (f) comparing said integrated nitrogen signal to a predetermined threshold value; and
    (g) signalling when said integrated nitrogen signal exceeds said predetermined threshold value;
    wherein the ratio of the strength of said predetermined rf field to the strength of said local magnetic field is from about 1:1 to about 50:1.

2. The method of claim 1, wherein the ratio of the strength of said predetermined rf field to the strength of said local field is from about 1:1 to about 30:1.

3. The method of claim 2, wherein the ratio of the strength of said predetermined rf field to the strength of said local field is from about 1:1 to about 20:1.

4. The method of claim 3, wherein the ratio of the strength of said predetermined rf field to the strength of said local field is from about 2:1 to about 20:1.

5. The method of claim 3, wherein the ratio of the strength of said predetermined rf field to the strength of said local field is from about 1:1 to about 10:1.

6. The method of claim 5, wherein the ratio of the strength of said predetermined rf field to the strength of said local field is from about 2:1 to about 10:1.

7. A method according to claim 1, wherein said step (a) generates said predetermined frequency of said train of radio frequency pulses to be near to a $^{14}$N NQR frequency of the type of explosive or narcotic to be detected.

8. A method according to claim 1, wherein said step (a) generates said train of radio frequency pulses comprising a strong off-resonance comb of radio frequency pulses.

9. A method according to claim 1, wherein said coil is a meanderline surface coil for detecting the class of explosives and narcotics in the specimen at predetermined areas.

10. A method according to claim 1, wherein said coil comprises a localized coil for detecting the class of explosives and narcotics in the specimen at predetermined regions.

11. A method according to claim 1, wherein said coil comprises a solenoidal coil for detecting the class of explosives and narcotics in the entire specimen.

12. A method according to claim 1, wherein said coil comprises a toroidal coil for detecting the class of explosives and narcotics in the specimen at predetermined regions.

13. A system for detecting a class of explosives and narcotics containing nitrogen in a specimen having a local magnetic field due to dipole-dipole contributions, by nuclear quadrupole resonance, said system including:
    a coil of predetermined size for irradiating the specimen with a train of radio frequency pulses of predetermined frequency and detecting an integrated nitrogen signal in response to irradiating the specimen;
    pulse generating means for generating said train of radio frequency pulses;
    coupling means for transmitting said train of radio frequency pulses to said coil and receiving said integrated nitrogen signal from said coil;
    comparing means for comparing said integrated nitrogen signal to a predetermined threshold value; and
    an alarm for signalling when said integrated nitrogen signal exceeds said predetermined threshold value;
    wherein said pulse-generating means causes said coil to irradiate said specimen with an rf field having a strength which is from about equal to the strength of the local magnetic field of said sample up to about 50 times the strength of the local magnetic field of the specimen.

14. The system of claim 13, wherein said pulse-generating means causes said coil to irradiate said specimen with an rf field having a strength which is from about equal to the strength of the local magnetic field of said sample up to about 30 times the strength of the local magnetic field of the specimen.

15. The system of claim 14, wherein said pulse-generating means causes said coil to irradiate said specimen with an rf field having a strength which is from about equal to the strength of the local magnetic field of said sample up to about 20 times the strength of the local magnetic field of the specimen.

16. The system of claim 15, wherein said pulse-generating means causes said coil to irradiate said specimen with an rf field having a strength which is from about equal to the strength of the local magnetic field of said sample up to about 10 times the strength of the local magnetic field of the specimen.

* * * * *